(12) United States Patent
Noguchi et al.

(10) Patent No.: US 11,129,279 B2
(45) Date of Patent: Sep. 21, 2021

(54) OPTICAL SUBASSEMBLY AND OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 17/010,722

(22) Filed: Sep. 2, 2020

(65) Prior Publication Data

US 2021/0076500 A1 Mar. 11, 2021

(30) Foreign Application Priority Data

Sep. 10, 2019 (JP) .............................. JP2019-164155

(51) Int. Cl.

| | |
|---|---|
| *H05K 1/18* | (2006.01) |
| *H05K 1/14* | (2006.01) |
| *H05K 1/03* | (2006.01) |
| *H05K 1/09* | (2006.01) |
| *H05K 1/11* | (2006.01) |
| *H04B 10/40* | (2013.01) |
| *H04B 10/50* | (2013.01) |
| *H04B 10/60* | (2013.01) |

(52) U.S. Cl.
CPC ............ *H05K 1/181* (2013.01); *H05K 1/0306* (2013.01); *H05K 1/09* (2013.01); *H05K 1/115* (2013.01); *H05K 1/14* (2013.01); *H04B 10/40* (2013.01); *H04B 10/501* (2013.01); *H04B 10/60* (2013.01)

(58) Field of Classification Search
CPC ........ H05K 1/181; H05K 1/0306; H05K 1/09; H05K 1/115; H05K 1/14; H04B 10/40; H04B 10/501; H04B 10/60
USPC ......................................................... 361/739
See application file for complete search history.

(56) References Cited

U.S. PATENT DOCUMENTS

| | | | |
|---|---|---|---|
| 10,080,889 B2* | 9/2018 | Marzano | A61N 1/375 |
| 2009/0187229 A1* | 7/2009 | Lavie | A61N 1/3754 607/36 |
| 2009/0243756 A1* | 10/2009 | Stevenson | A61N 1/3754 333/172 |
| 2018/0123316 A1* | 5/2018 | Nagarajan | H01S 5/0064 |

FOREIGN PATENT DOCUMENTS

JP 2011-108939 A 6/2011

* cited by examiner

*Primary Examiner* — Binh B Tran
(74) *Attorney, Agent, or Firm* — Mattingly & Malur, PC (57) ABSTRACT

An optical subassembly includes: a support block made of ceramic in front of the first surface, the support block having a substrate mounting surface, the support block having a first side opposite to a surface in front of the first surface; an element-mounted substrate on the substrate mounting surface, the element-mounted substrate having a first conductor pattern; a pedestal made of metal and configured to be the same potential as the eyelet, the pedestal situated in front of the first surface; and a lead pin in the through-hole and for transmitting the electric signal. The support block has a metallization pattern that is electrically connected to the pedestal and is continuous from at least a part of the substrate mounting surface to at least a part of the first side.

15 Claims, 8 Drawing Sheets

OPTICAL SUBASSEMBLY AND OPTICAL MODULE

CROSS-REFERENCE TO RELATED APPLICATION

The present application claims priority from Japanese application JP2019-164155 filed on Sep. 10, 2019, the content of which is hereby incorporated by reference into this application.

BACKGROUND

1. Field

This relates to an optical subassembly and an optical module.

2. Description of the Related Art

Currently, most of the internet and telephone networks are built with optical communication networks. Optical modules used for interfaces of optical communication equipment such as a router/switch or transmission equipment play an important role to convert electric signals into optical signals. The optical module is usually designed to have an optical subassembly storing an optical element, a printed circuit board (hereinafter referred to as PCB) on which ICs may be mounted for dealing with signals such as modulation electric signals, and a flexible printed circuit board (hereinafter referred to as FPC) electrically connecting between them.

Recently, not only higher speed but also lower price is extremely required for optical modules; demand is rising for optical modules capable of transmitting and receiving high-speed optical signals at low cost. Such optical modules to meet the requirement may be a TO-CAN package type optical subassembly with lead pins, protruding from a metallic stem in a can-shaped package, for being inserted into the FPC. The metallic stem includes a disk-like eyelet and a pedestal projecting from the eyelet. The above requirement leads to highly technical demand for a broadband TO-CAN type TOSA operable over a wide temperature range.

Under current trends for high-speed operation at 50 Gbit/s class, an electro-absorption (EA) modulator integrated laser (EML) is appropriate for a light source, but light absorption characteristics greatly depend on temperature, whereby a Peltier cooling device is usually used together. However, a recent study about operation of the EML over the wide temperature range shows that operation of no temperature control without the Peltier device is feasible in a stable temperature environment such as a data center.

Other demand for optical modules has recently been rising in a field of interface standard for connecting a control unit and a radio unit at a radio base station, so-called CPRI (Common Public Radio Interface). The CPRI is a standard of interfaces for connecting the radio equipment control (REC) at the radio base station and the radio equipment (RE). The REC deals with baseband signal processing and control/management in a digital area; the RE deals with amplification, modulation and demodulation, and filtering of radio signals in an analog area. Connecting the REC and the RE with optical signals capable of long-distance transmission enables the RE to be used in an outdoor installation space near an antenna and far from the base station. However, the outdoor installation necessitates operability under severe temperature environment. Accordingly, in addition to the price reduction due to the market demand, operability is required over a wide temperature range of −40 to 85° C., called I-Temp (Industrial temperature range). For such applications, the EML and the Peltier device should be used together, whereby importance is placed on improvement of heat dissipation inside a package for lower power consumption.

On the other hand, small modules such as the TO-CAN package type, due to not high heat dissipation, the operable temperature range is limited. Improvement of the heat dissipation and the high frequency characteristics of the TO-CAN package type can meet the market requirement.

JP 2011-108939A discloses that the Peltier temperature controller and the optical element are stored in the TO-CAN type TOSA module. JP 2011-108939A discloses that a subcarrier substrate with an optical element mounted thereon is mounted on a metallic carrier, and the metallic carrier is connected by wire bonding to a metallic pedestal integrated with an eyelet, for enhancing ground and improving high frequency characteristics.

However, balancing the improvement of the high frequency characteristics and downsizing is difficult in JP 2011-108939A. In detail, JP 2011-108939A discloses that the metallic carrier is wire-bonded to the metallic pedestal for the improvement of the high frequency characteristics, whereby the downsizing is difficult, due to difficulty of forming the metallic carrier.

SUMMARY

This is in consideration of the above-mentioned problem and aims at balancing improvement of high frequency characteristics and downsizing in an optical subassembly with a lead pin inserted into a through-hole in an eyelet.

An optical subassembly includes: an eyelet having a first surface, the eyelet having a second surface opposite to the first surface, the eyelet having a through-hole penetrating from the second surface to the first surface; a support block made of ceramic in front of the first surface, the support block having a substrate mounting surface, the support block having a first side opposite to a surface in front of the first surface; an element-mounted substrate on the substrate mounting surface, the element-mounted substrate having a first conductor pattern; an optical element for converting an optical signal and an electric signal at least from one to another, the optical element mounted on the element-mounted substrate, the optical element being electrically connected to the first conductor pattern; a pedestal made of metal and configured to be the same potential as the eyelet, the pedestal situated in front of the first surface; a lead pin in the through-hole and for transmitting the electric signal; and a relay board on the pedestal, the relay board having a second conductor pattern for transmitting the electric signal between the lead pin and the first conductor pattern. The support block has a metallization pattern that is electrically connected to the pedestal and is continuous from at least a part of the substrate mounting surface to at least a part of the first side.

An optical module includes: the optical subassembly; a printed circuit board; and a flexible printed circuit board electrically connected to the printed circuit board and the optical subassembly.

DETAILED DESCRIPTION

A first embodiment is explained below with reference to drawings.

Figure 1:
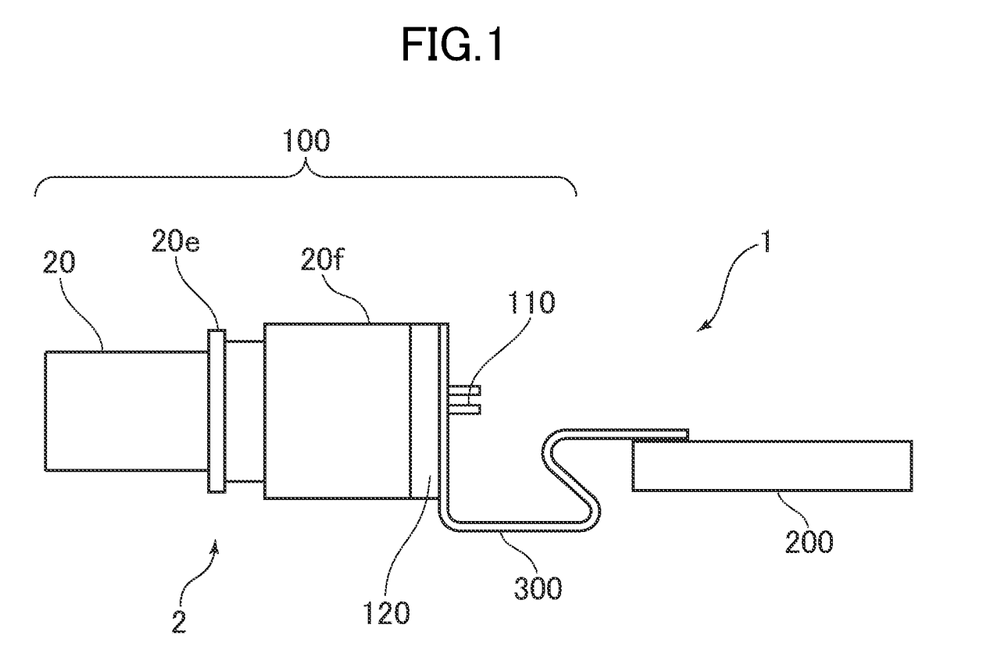
FIG. 1 is an exterior view of an optical module in a first embodiment.

FIG. 1 is an exterior view of an optical module 1 for optical communication in the embodiment. Signals such as modulation electric signals and control signals are transmitted from a driver IC (not shown) on a PCB 200, through an FPC 300 connected to the PCB 200 with material such as solder, to an optical subassembly 100. The FPC 300 is a circuit substrate with flexibility. The optical subassembly 100 stores an optical element and is equipped with interfaces for transmitting outgoing light or receiving incident light. The optical subassembly 100 includes an eyelet 120 and an optical receptacle 2. The optical module 1 is configured to have an unillustrated housing, made of material such as metal, for storing the optical subassembly 100, the PCB 200, and the FPC 300.

Figure 2:
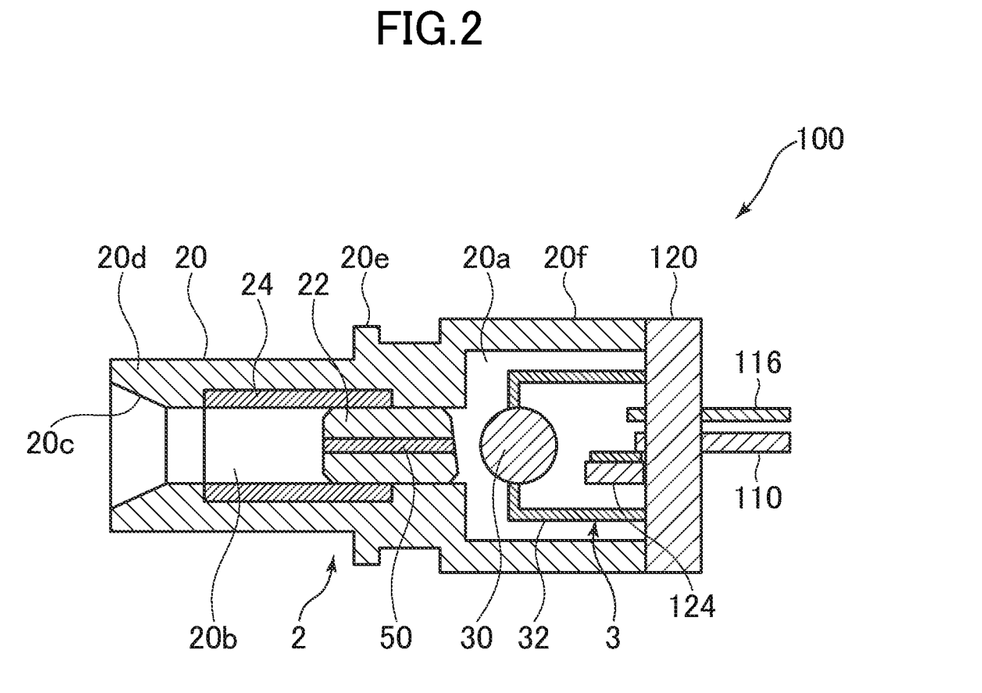
FIG. 2 is a schematic view of cross section structure of an optical subassembly in the first embodiment.

FIG. 2 is a schematic view of cross section structure of an optical subassembly 100 in the embodiment. In FIG. 2, the optical subassembly 100 in the embodiment includes the optical receptacle 2 and an optical package 3. The optical receptacle 2 has an optical receptacle body 20, a stub 22, and a sleeve 24.

The optical receptacle body 20 in the embodiment is configured to include an integrated resin member, with an optical package storage unit 20f in a cylindrical contour, and with an optical fiber insertion part 20d in an almost cylindrical shape smaller in outer diameter than the optical package storage unit 20f. The optical package storage unit 20f and the optical fiber insertion part 20d are connected at respective edge faces.

The optical package storage unit 20f has a cylindrical shape with a recess 20a in a circular shape coaxial with the contour.

The optical receptacle body 20 has a through-hole 20b extending from a tip surface of the optical fiber insertion part 20d, to a bottom surface of the recess 20a in the optical package storage unit 20f, being coaxial with the contour of the optical fiber insertion part 20d. Namely, the optical receptacle body 20 has the recess 20a and the through-hole 20b penetrating outward from the recess 20a.

The through-hole 20b at a tip on an internal surface has a tapered section 20c in a tapered shape with larger diameter toward the tip. This makes it easy to insert a connector with an external optical fiber into the through-hole 20b.

The optical fiber insertion part 20d has a flange 20e along a perimeter.

The stub 22 is formed from materials including zirconia. The stub 22 has a roughly cylindrical shape of almost the same diameter as the through-hole 20b in the optical fiber insertion part 20d of the optical receptacle body 20, holding the optical fiber 50 coaxial with the stub 22. The stub 22 is fixed by press-fitting to the optical fiber insertion part 20d of the optical receptacle body 20. The stub 22 has a right edge surface obliquely grinded. This prevents interference between light input to the optical fiber 50 and light reflected thereto.

The stub 22 of the optical receptacle 2 has a left side, in contact with a connector (not shown) equipped with an external optical fiber inserted from outside to the through-hole 20b, for connecting the external optical fiber on the connector and the optical fiber 50 held by the stub 22.

The sleeve 24 includes split sleeves formed from material such as zirconia. The sleeve 24 has a roughly cylindrical shape of almost the same inner diameter as the through-hole 20b, and is embedded in a trench in the internal surface of the optical receptacle body 20. The sleeve 24 enables position adjustment, in the through-hole 20b, of the connector equipped with the external optical fiber inserted into the optical fiber insertion part 20d.

The optical package 3 has a lens 30 in a spherical shape. The optical package 3 has a lens support portion 32, which is a metallic member in a bottomed tubular shape with an opening in a bottom surface and of almost the same diameter as the lens 30. The opening of the lens support portion 32 is coaxial with a shape of the bottom surface of the lens support portion 32. Thus, the lens 30 fits in the opening of the lens support portion 32. Namely, the lens support portion 32 supports the lens 30.

The optical package 3 has a stem including the eyelet 120 and a pedestal 124. The stem is made of material such as metal, electrically connected to a ground conductor on the FPC 300, and electrically grounded.

By adhesively fixing the bonding surfaces of the optical receptacle body 20 and the first surface 121 of the eyelet 120, the optical subassembly 100 is assembled. The optical receptacle body 20 and the eyelet 120 constitute the housing. The lens support portion 32 welded to the eyelet 120 and the lens 30 fit in the lens support portion 32 are small enough to be in the recess 20a of the optical receptacle 2. Namely, the lens 30 and the lens support portion 32 are stored in the recess 20a of the optical receptacle body 20. How to bond the optical receptacle 2 and the optical package 3 is not limited to this way.

The optical subassembly 100 may be exemplified by a transmitter optical subassembly (TOSA) storing a light-emitting element such as a laser diode for transmitting optical signals converted from electric signals, a receiver optical subassembly (ROSA) storing a light-receiving element typified by a photodiode for converting received optical signals to electric signals, bidirectional optical subassembly (BOSA) with both functions. Although either optical subassembly is applicable, a transmitter optical subassembly is explained as an example in the embodiment.

Figure 3:
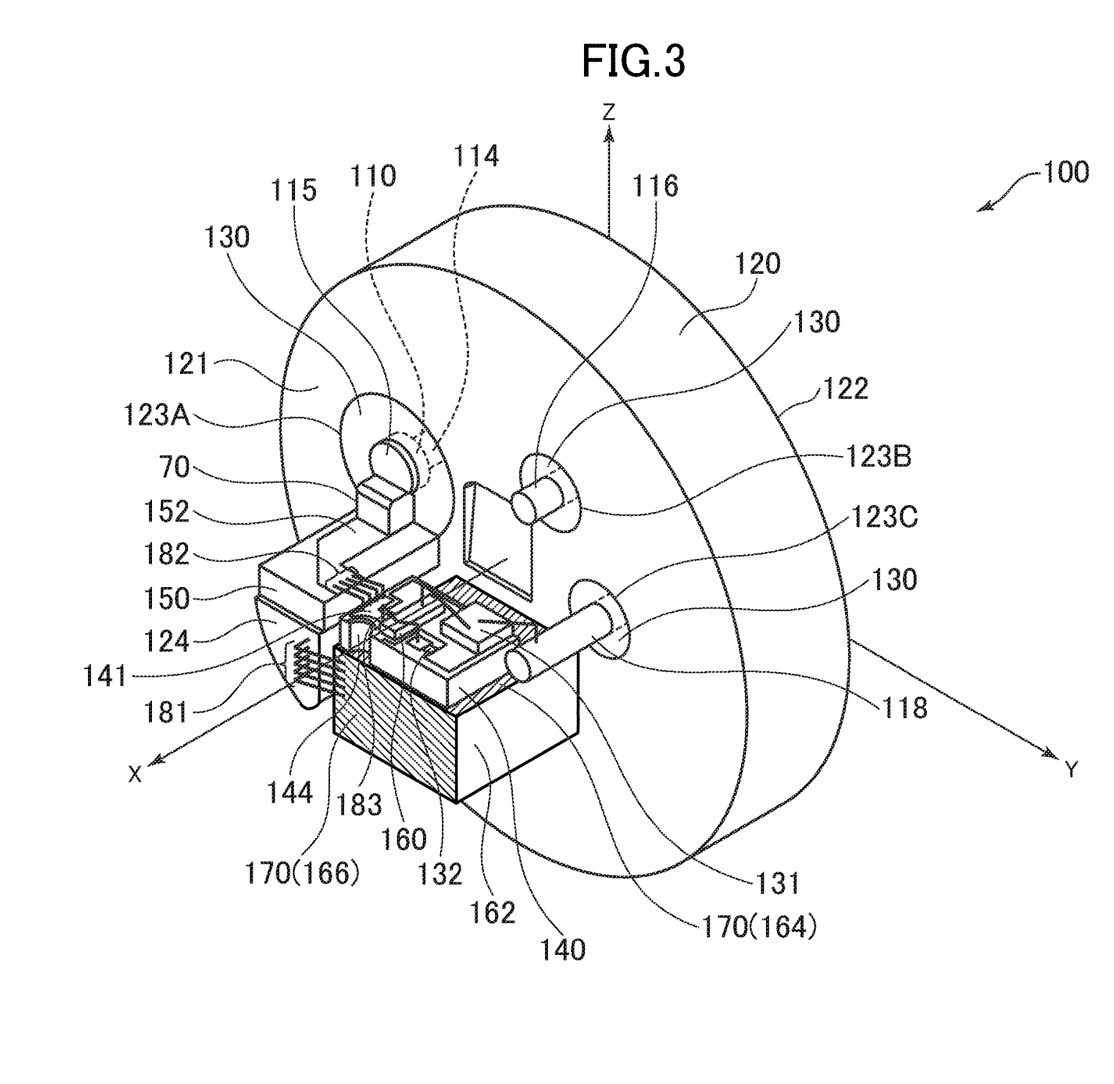
FIG. 3 is a schematic perspective view of an interior of the optical subassembly in the first embodiment.

FIG. 3 is a schematic perspective view of an interior of the optical subassembly 100 included in the optical module 1 in the first embodiment. The optical subassembly 100 has the eyelet 120 with a diameter of 5.6 mm, in a disk shape, with conductivity, and made of material such as metal. The eyelet 120 has the first surface 121 and a second surface 122 opposite to the first surface 121. The eyelet 120 has some through-holes 123 (123A, 123B, 123C) penetrating from the first surface 121 to the second surface 122.

A first lead pin 110 is inserted in the first through-hole 123A. In the embodiment, as shown in FIG. 3, the first lead pin 110 for transmitting modulation electric signals has a small diameter portion 114 and a large diameter portion 115 at an edge of the small diameter portion 114 and larger in diameter than the small diameter portion 114. At least a part of the large diameter portion 115 is exposed in front of the first surface 121 and from the first surface 121. Thus, the first lead pin 110 has the large diameter portion 115, whereby the optical module 1 can achieve further impedance matching. A second lead pin 116 is inserted into a second through-hole 123B; a third lead pin 118 is inserted in a third through-hole 123C. The first lead pin 110, the second lead pin 116, and the third lead pin 118 extend in a direction (X axis direction) perpendicular to the first surface 121 of the eyelet 120, project from the first surface 121 of the eyelet 120; the first lead pin 110 is for transmitting modulation electric signals to an optical element 160. The optical element 160 is an element such as a semiconductor laser for converting an optical signal and an electric signal at least from one to another.

Dielectric 130 such as glass, filled in each through-hole 123, intervenes between the first through-hole 123A and the first lead pin 110, between the second through-hole 123B and the second lead pin 116, and between the third through-hole 123C and the third lead pin 118. The dielectric 130 such as the glass holds each lead pin in each through-hole 123. The eyelet 120, the dielectric 130, and the first lead pin 110 constitute a coaxial line.

The optical subassembly 100 includes a pedestal 124 in front of the first surface 121 of the eyelet 120. In the embodiment, the pedestal 124 is made of metal and projects in an extension direction (X axis direction) of the first lead pin 110 from the first surface 121 of the eyelet 120. The example in FIG. 3 has the eyelet 120 and the pedestal 124 integrated. The eyelet 120 and the pedestal 124 are of the same potential, constituting the stem. The stem in the embodiment is made by press working and is made of rolled steel with a thermal conductivity of 50 to 70 W/m·K.

A relay board 150 is fixed on a surface of the pedestal 124 with solder or conductive adhesive. There is a second conductor pattern 152 on a surface of the relay board 150 for transmitting modulation electric signals between the first lead pin 110, and a first conductor pattern 141 and an optical element 160 that are described later. In the embodiment, the modulation electric signals from the first lead pin 110 are transmitted, through the second conductor pattern 152, to the first conductor pattern 141 and the optical element 160. The second conductor pattern 152 and the large diameter portion 115 of the first lead pin 110 are connected by means of material such as solder 70. The connection between the large diameter portion 115 of the first lead pin 110 and the second conductor pattern 152 is not limited to soldering, and brazing (brazing and soldering) by other brazing filler is applicable.

The first conductor pattern 141 on the element-mounted substrate 140 is connected to the second conductor pattern 152 on the relay board 150 through second bonding wires 182 consisting of some wires, thereby reducing parasitic inductance, enabling the impedance matching up to the high frequency area. The relay board 150 has the second conductor pattern 152, whereby a lower surface of the large diameter portion 115 of the first lead pin 110 and the second conductor pattern 152 can be brazed (or soldered); there is a capacitance component formed between the lower surface of the large diameter portion 115 of the first lead pin 110 and a ground pattern (not shown) in front of the back of the relay board 150, thereby enabling the impedance matching up to the high frequency area.

Additionally, the optical subassembly 100 has a support block 162 disposed to project in the extension direction (X axis direction) of the first lead pin 110, in front of the first surface 121 of the eyelet 120. The support block 162 is spaced from the pedestal 124, in the Y axis direction parallel to the upper surface of the pedestal 124 and parallel to the first surface 121 of the eyelet 120, and may be fixed to the first surface 121 of the eyelet 120 with solder or conductive adhesive. The support block 162 is made of ceramic, whereby high precision processing is easily possible, compared with the metallic pedestal 124. This enables downsizing of the optical subassembly 100 and downsizing of the optical module 1. In the disclosure, the ceramic includes inorganic solid material such as a green compact, powders, or a film, of inorganic compounds such as oxide, carbide, nitride, and boride, regardless of being metal or nonmetal; in the embodiment, the ceramic used for the support block 162 is aluminum nitride with thermal conductivity of 170-200 W/m·K.

The support block 162 has a surface facing the Z axis direction which is a substrate mounting surface 164, on which the element-mounted substrate 140 is mounted. The element-mounted substrate 140 has a surface, facing the Z axis direction, on which the optical element 160 is mounted. The element-mounted substrate 140 has a first conductor pattern 141, on the surface facing the Z axis direction, for being electrically connected to the optical element 160 and for transmitting the modulation electric signals to the optical element 160. The element-mounted substrate 140 is made from insulation materials with high thermal conductivity and with thermal expansion coefficient close to that of optical element 160. In the embodiment, the element-mounted substrate 140 may be made from aluminum nitride. The first conductor pattern 141 and the optical element 160 are electrically connected through a bonding wire 183. In addition to the optical element 160, a thin film resistance 132 and a bypass condenser 131 may be mounted on the element-mounted substrate 140. The modulation electric signals, with the high frequency components, stop at the thin film resistance 132, preventing the reflected wave from returning to the driver IC (not shown). The bypass condenser 131 separates the high frequency signals superimposed on direct current signals.

The element-mounted substrate 140 has a castellation 144 on a side facing the X axis direction. Specifically, among sides of the element-mounted substrate 140, the castellation 144 is disposed on the side opposite to a surface in front of the first surface 121 of the eyelet 120. This allows the castellation 144 to raise a position of the ground potential in a metallization pattern 170 up to the surface of the element-mounted substrate 140 on which the optical element 160 is mounted, thereby enabling a stable flow of a conduction current to the stem generated by electromagnetic fields emitted by propagation of the high frequency signals, stabilizing the ground, reducing loss of high frequency signals.

Figure 4:
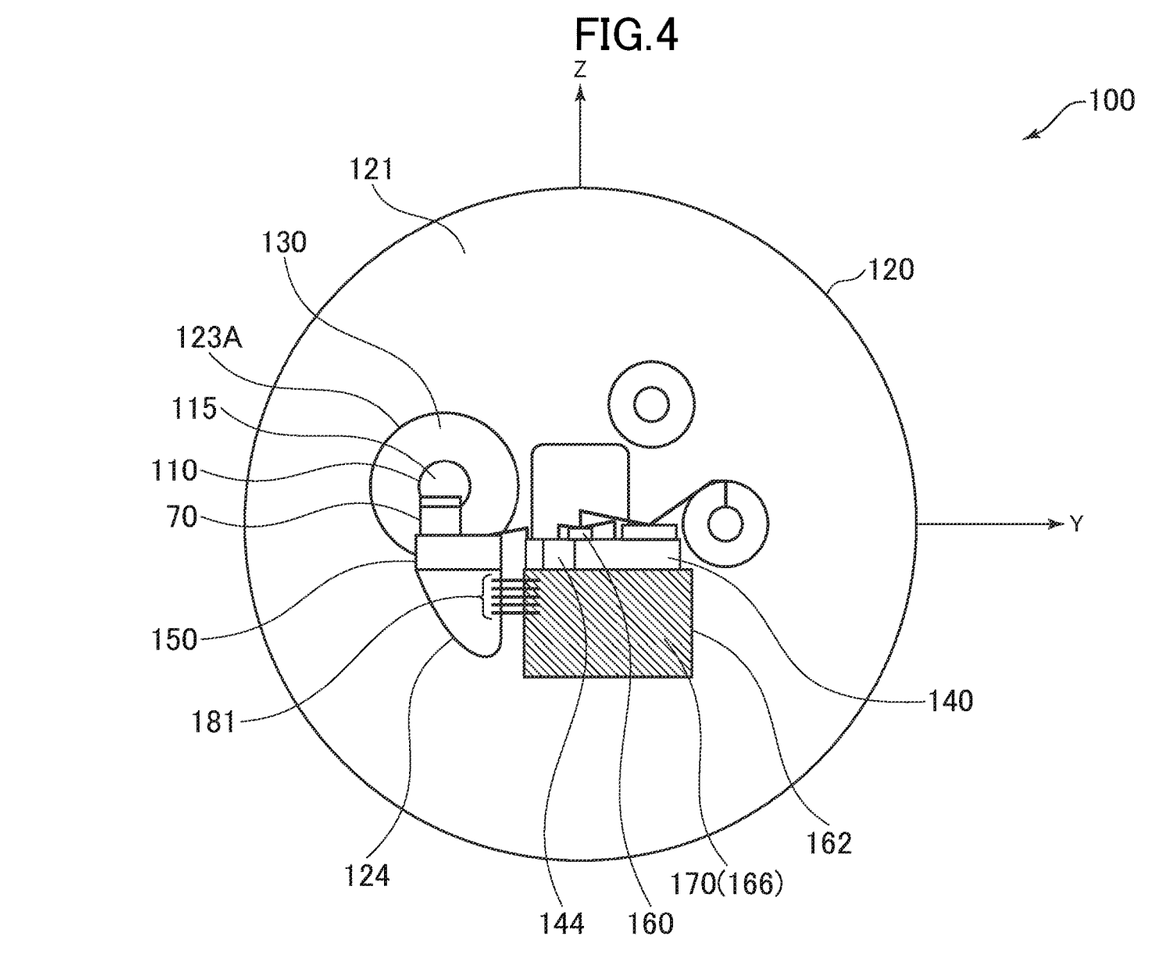
FIG. 4 is a schematic plan view of the optical subassembly seen from a direction perpendicular to a first surface of an eyelet in the first embodiment.

As shown in FIG. 4, the castellation 144 should be disposed at a position where the optical element 160 is mounted or at another position closer to the pedestal 124 than the position where the optical element 160 is mounted (left in FIG. 4), in a direction parallel to the first surface 121 of the eyelet 120 and parallel to the surface of the element-mounted substrate 140 (the direction same as the Y axis direction in the embodiment). Thus, the castellation 144 for a ground conductor can be disposed at a position close to a route where the high frequency signal current flows, thereby reducing generation of the loss of the high frequency signals.

In FIG. 3, the support block 162 has the substrate mounting surface 164 on which the element-mounted substrate 140 is mounted and a first side 166 that is not opposed to the substrate mounting surface 164. In the embodiment, the first side 166 is a side that faces the X axis direction and is opposite to the surface in front of the first surface 121 of the eyelet 120. The metallization pattern 170 is continuous from at least a part of the substrate mounting surface 164 to at least a part of the first side 166.

The metallization pattern 170 on the first side 166 and the pedestal 124 are electrically connected through the first bonding wires 181 and of the same potential. The metallization pattern 170 on the substrate mounting surface 164 is in contact with and electrically connected to a ground pattern (not shown) on a back of the element-mounted substrate 140, namely, a surface facing the substrate mounting surface 164 of the support block 162. This enables a return current that flows in the stem as the ground conductor to flow in a route near the route where the modulation electric signals as the high frequency signals flow, stabilizing the ground, improving the high frequency characteristics. Specifically, in FIG. 3, the first bonding wires 181 include two or more bonding wires, thereby further stabilizing the ground, further improving the high frequency characteristics.

Figure 5:
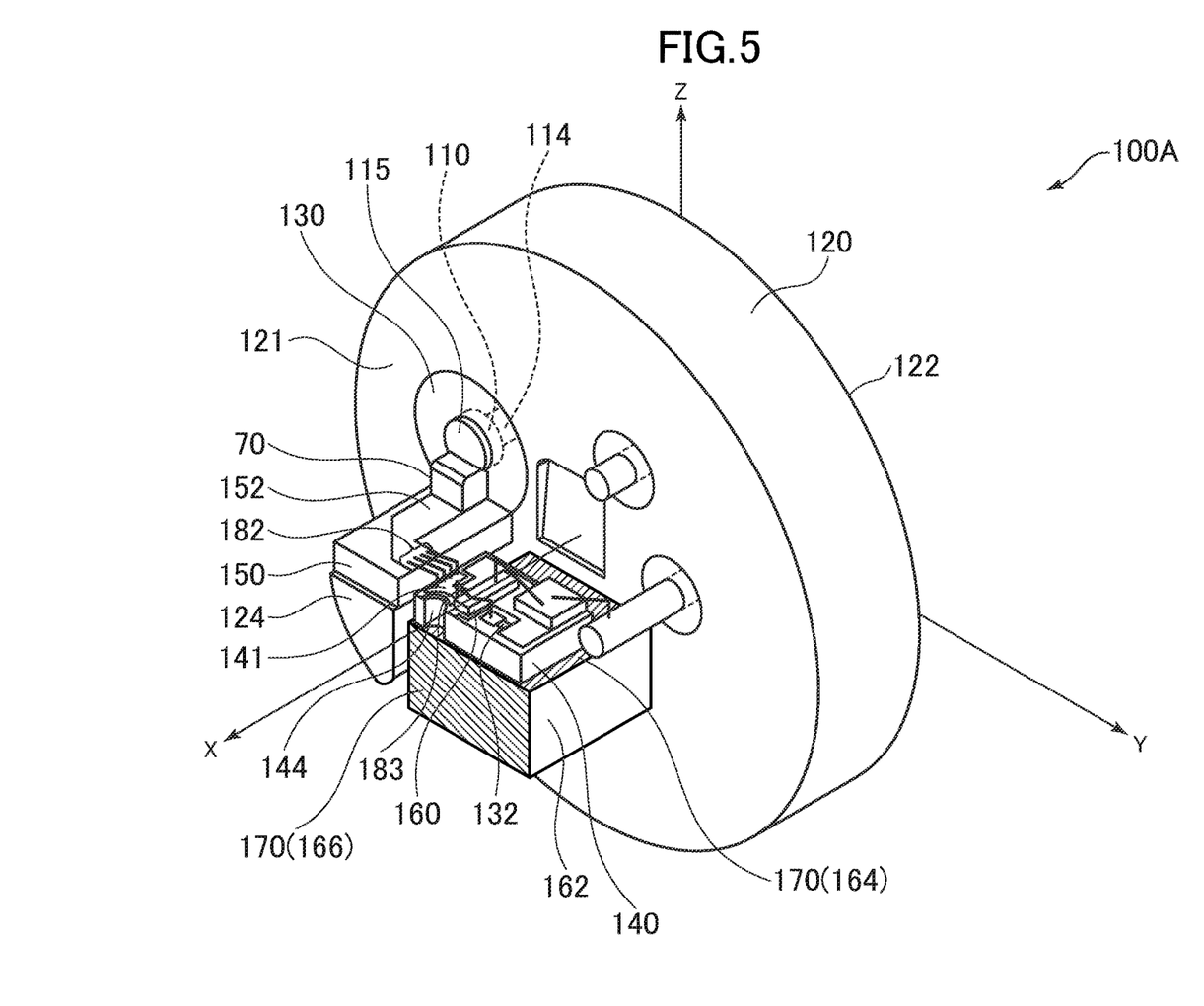
FIG. 5 is a schematic perspective view of an interior of an optical subassembly in another example of the first embodiment.

FIG. 5 is a perspective view of an optical subassembly 100A included in the optical module 1 in another example of the embodiment. The optical subassembly 100A in FIG. 5 has the same structure as the optical subassembly 100 in FIG. 3, apart from not having the first bonding wire 181.

Figure 6:
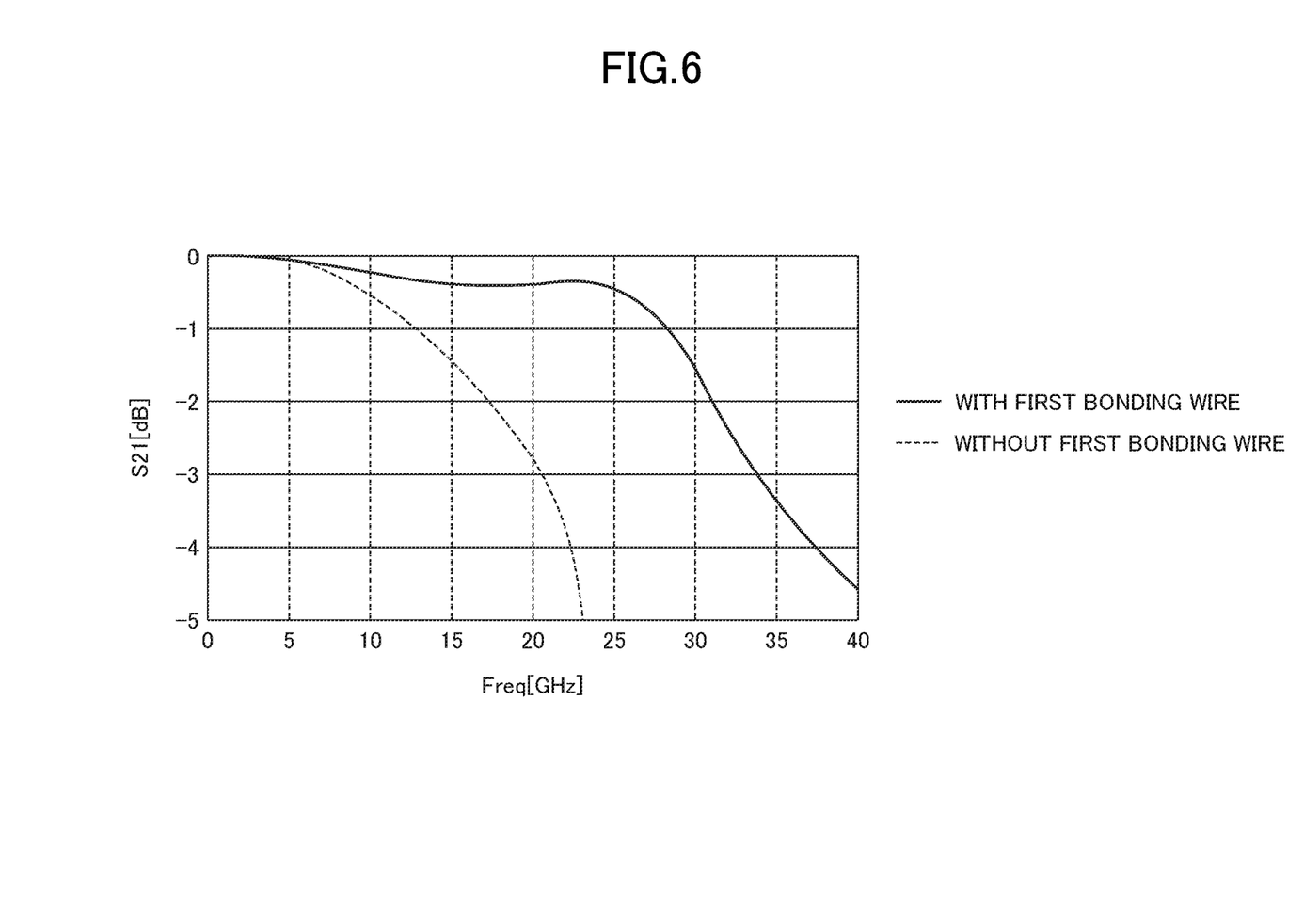
FIG. 6 is a graph of transmission characteristics (S21), of the optical module in the first embodiment, calculated using a three-dimensional electromagnetic field simulator HFSS (High Frequency Structure Simulator).

FIG. 6 is a graph of transmission characteristics (S21), calculated using a three-dimensional electromagnetic field simulator HFSS (High Frequency Structure Simulator), of the optical module 1 with the first bonding wires 181 in FIG. 3 and without the first bonding wire 181 in FIG. 5. In FIG. 6, with respect to the high frequency characteristics, the structure with the first bonding wires 181 has higher transmission characteristics than the structure without the first bonding wire 181. This is because the ground is stabilized by the optical subassembly 100 being equipped with the first bonding wires 181.

Ground connection can be established, without providing the first bonding wire 181, by forming the metallization pattern on the surface of the support block 162 in contact with the first surface 121 of the eyelet 120, and by connecting the metallization pattern and the first surface 121 through conductive adhesive or solder; the return current flowing in the ground conductor should flow through a route as close as possible to the route where the high frequency signal current flows. Thus, as shown in FIG. 3, the optical subassembly 100 should be equipped with the first bonding wires 181, for supplying the ground potential through a route just below the relay board 150 where the high frequency signal current flows.

Assuming that both the relay board 150 and the element-mounted substrate 140 are mounted on one metallic pedestal, the first bonding wires 181 are unnecessary because there is a path of the return current flowing in the ground conductor just below the path where the high frequency current flows; by contrast, in the embodiment where the pedestal 124 on which the relay board 150 is mounted is independent from the support block 162 on which the element-mounted substrate 140 is mounted, the first bonding wires 181 should be provided for the above reasons.

The metallization pattern 170 in FIG. 3 is formed all over the substrate mounting surface 164 of the support block 162 and all over the first side 166 but may be formed on a part of the substrate mounting surface 164 of the support block 162 and a part of the first side 166. In this case, however, the metallization pattern 170 on the substrate mounting surface 164 should have enough area to secure electrical connection with the ground pattern on the back of the element-mounted substrate 140; the metallization pattern 170 on the first side 166 should have enough area to provide the first bonding wires 181; the metallization pattern 170 should be continuous from the substrate mounting surface 164 to the first side 166.

FIG. 3 shows that the metallization pattern 170 is formed only on the substrate mounting surface 164 and the first side 166 of the support block 162, but the metallization pattern 170 may be formed on three or more surfaces of the support block 162. However, the metallization pattern 170 should be formed only on the substrate mounting surface 164 of the support block 162 and the first side 166, as shown in FIG. 3, from a view point of manufacturing processes, due to necessity of a dicing process and a thin film vapor deposition process for forming the metallization pattern 170. Furthermore, assuming that the support block 162 is formed from material with high permittivity such as aluminum nitride, the support block 162 should not have the metallization pattern 170 on its surfaces opposite to each other, thereby suppressing generation of dielectric resonance, improving the high frequency characteristics. Thus, the metallization pattern 170, which is formed on the substrate mounting surface 164 of the support block 162 in the embodiment, should not be formed on a surface (lower surface in FIG. 3) opposite to the substrate mounting surface 164. Additionally, the metallization pattern 170, which is formed on the first side 166 of the support block 162 in the embodiment, should not be formed on a surface (surface in front of the first surface 121 of the eyelet 120) opposite to the first side 166.

Figure 7:
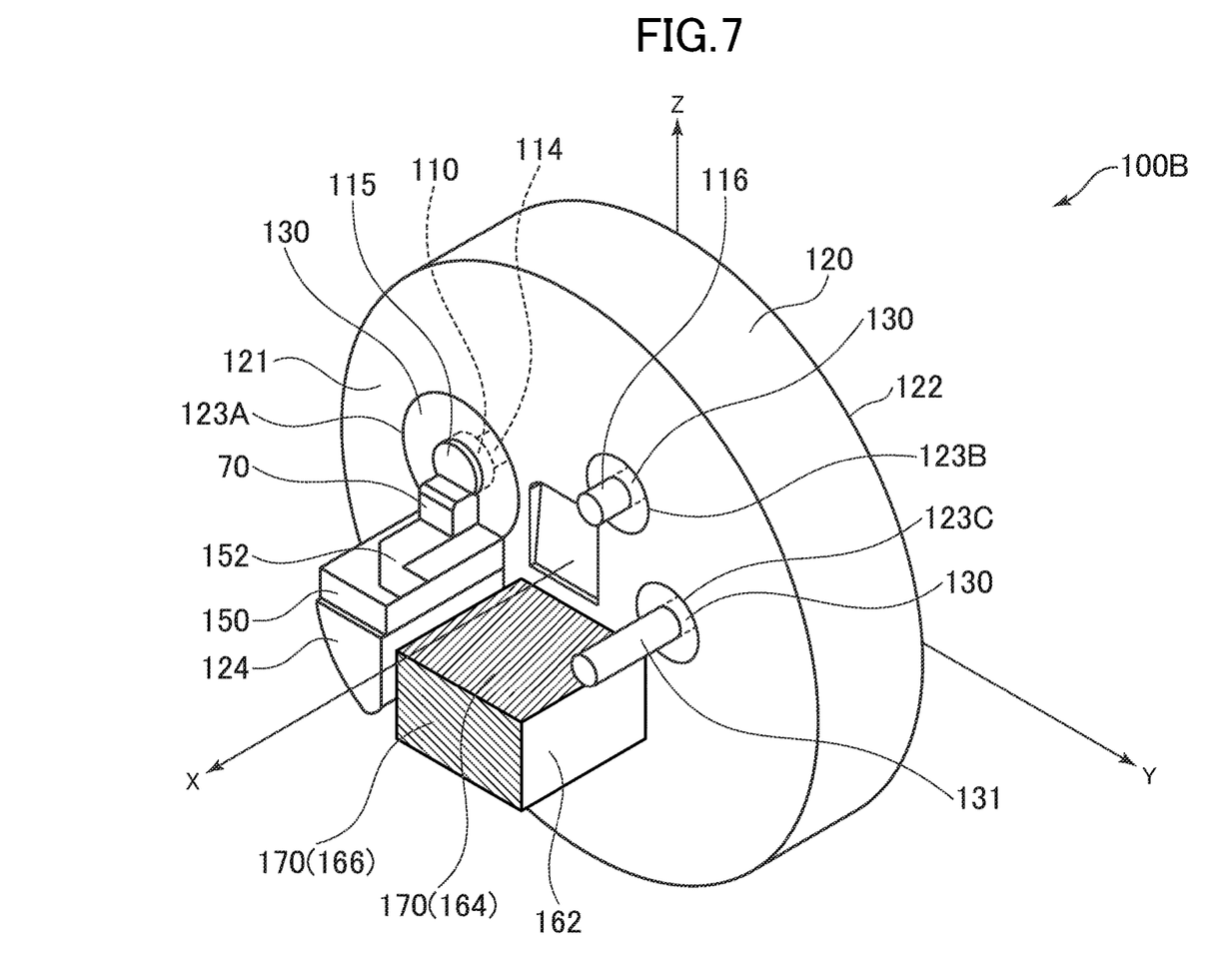
FIG. 7 is a schematic perspective view of manufacturing process of the optical subassembly in the first embodiment.

A manufacturing method of the optical subassembly 100 is explained using FIG. 7. FIG. 7 is a perspective view of a work-in-process 100B of the optical subassembly 100 included in the optical module 1 in the embodiment. In the example in FIG. 7, the relay board 150 is mounted on the upper surface of the pedestal 124, and the large diameter portion 115 of the first lead pin 110 and the second conductor pattern 152 are connected through the solder 70, followed by mounting the support block 162 on the first surface 121 of the eyelet 120. During that time, the support block 162 is adjustable for its mounting position in the Z axis direction perpendicular to the substrate mounting surface 164 of the support block 162 and in the Y axis direction.

Then, the optical element 160 is mounted on the element-mounted substrate 140 in FIG. 3.

After that, as shown in FIG. 3, the element-mounted substrate 140 that mounts the optical element 160 is mounted on the substrate mounting surface 164 of the support block 162. In doing so, the element-mounted substrate 140 is adjustable for position in the X axis direction and the Y axis direction.

Thus, although the support block 162 and the element-mounted substrate 140 are made of the same material (aluminum nitride in the embodiment), both of them are separated, and the eyelet 120 and the support block 162 are separated, whereby the optical element 160 of the optical subassembly 100 is adjustable for its three-dimensional position during the manufacturing processes. As a result, in spite of variation in size of all sorts of components constituting the optical subassembly 100, the lens 30 in FIG. 2 can be matched to a luminous point position of the optical element 160, whereby desired optical output can be obtained.

Figure 8:
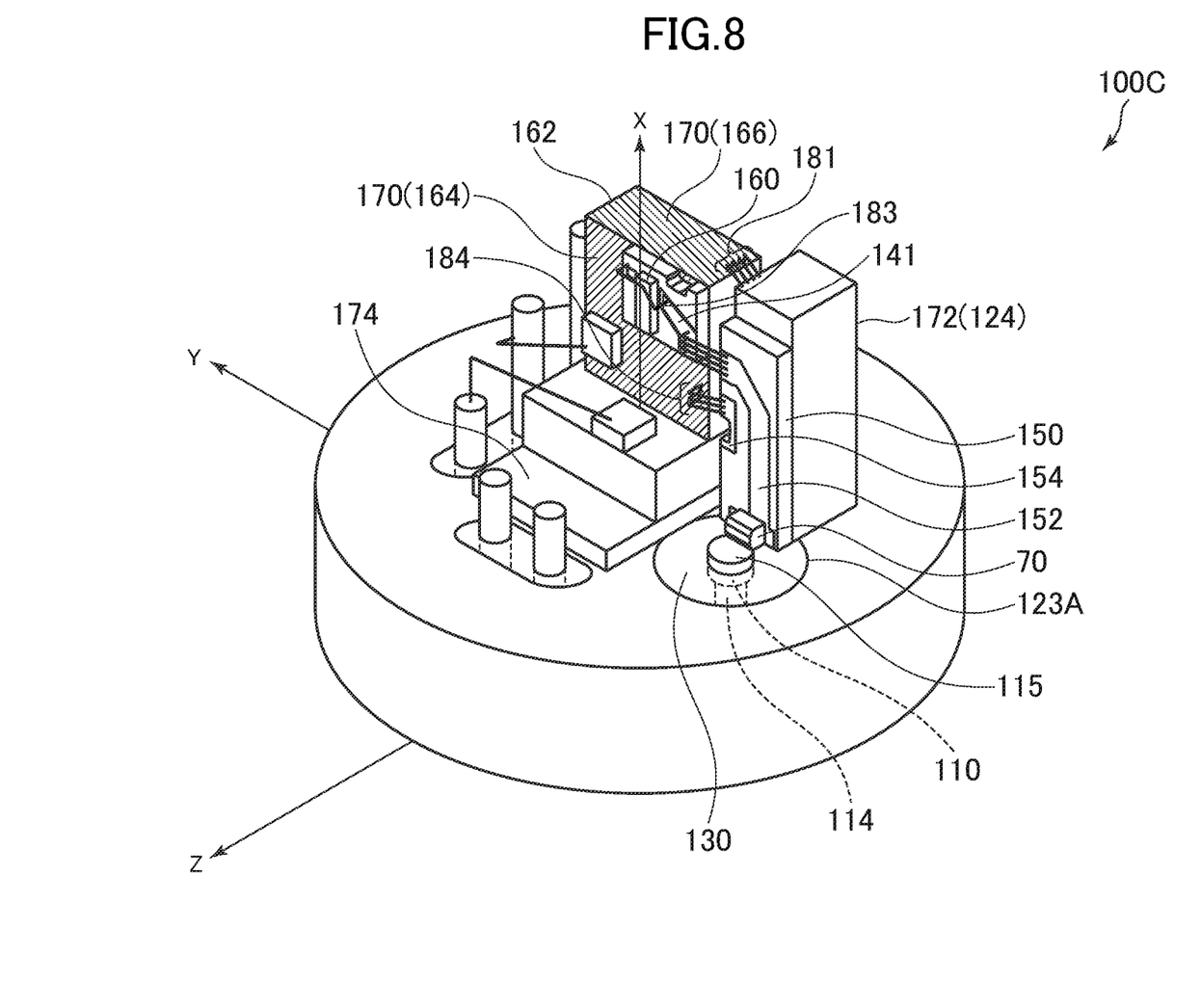
FIG. 8 is a schematic perspective view of an interior of an optical subassembly in still another example of the first embodiment.

FIG. 8 is a perspective view of an optical subassembly 100C included in the optical module 1 in another example of the embodiment. The optical subassembly 100C in FIG. 8 has the pedestal 124 configured to be a metal block 172 separated from the eyelet 120; the relay board 150 is mounted on the upper surface of the metal block 172. A Peltier device 174, a temperature controller, intervenes between the first surface 121 of the eyelet 120 and the support block 162.

In such a configuration, the support block 162 is made of ceramic, thereby facilitating high precision processing, enabling downsizing of the optical subassembly 100C and downsizing of the optical module 1.

Additionally, the eyelet 120, the support block 162, and the element-mounted substrate 140 are separated, whereby during manufacturing processes, three-dimensional position of the optical element 160 in the optical subassembly 100 can be adjusted.

Just like the example in FIG. 3, the metal block 172, which is of the same potential as the eyelet 120, should be connected to the first side 166 of the support block 162 through the first bonding wire 181.

The relay board 150 in the example in FIG. 8 has a ground pattern 154 of the same potential as the metal block 172, extending from the back in contact with the metal block 172, through the side facing the Y axis direction, to a part of the surface facing the Z axis direction. The metallization pattern 170 on the substrate mounting surface 164 of the support block 162 and the ground pattern 154 on the surface of the relay board 150 are connected through a bonding wire 184. This can further stabilize ground potential, desirably. Forming the ground pattern 154 onto the surface of the metal block 172 is not essential; instead, for example, the ground pattern 154 may be formed from the back in contact with the metal block 172 and onto the side facing the Y axis direction, and the ground pattern 154 on the side of the metal block 172 may be connected to the metallization pattern 170 on the substrate mounting surface 164 of the support block 162 through the bonding wire 184.

The configuration of the optical subassembly 100C with the ground pattern 154 and the third bonding wire 184 is also applicable to the optical subassembly 100 in FIG. 3.

What is claimed is:

1. An optical subassembly comprising:
   an eyelet having a first surface, the eyelet having a second surface opposite to the first surface, the eyelet having a through-hole penetrating from the second surface to the first surface;
   a support block made of ceramic in front of the first surface, the support block having a substrate mounting surface, the support block having a first side opposite to a surface in front of the first surface;
   an element-mounted substrate on the substrate mounting surface, the element-mounted substrate having a first conductor pattern;
   an optical element for converting an optical signal and an electric signal at least from one to another, the optical element mounted on the element-mounted substrate, the optical element being electrically connected to the first conductor pattern;
   a pedestal made of metal and configured to be the same potential as the eyelet, the pedestal situated in front of the first surface;
   a lead pin in the through-hole and for transmitting the electric signal; and
   a relay board on the pedestal, the relay board having a second conductor pattern for transmitting the electric signal between the lead pin and the first conductor pattern,
   wherein the support block has a metallization pattern that is electrically connected to the pedestal and is continuous from at least a part of the substrate mounting surface to at least a part of the first side.

2. The optical subassembly according to claim 1, further comprising a first bonding wire connecting the pedestal and the metallization pattern, which is disposed on at least the part of the first side.

3. The optical subassembly according to claim 2, wherein the first bonding wire includes two or more bonding wires.

4. The optical subassembly according to claim 1, wherein the metallization pattern is not on a surface opposite to the substrate mounting surface.

5. The optical subassembly according to claim 1, wherein the metallization pattern is not on the surface opposite to the first side.

6. The optical subassembly according to claim 1, wherein the element-mounted substrate has a ground pattern, and the metallization pattern is electrically connected to the ground pattern.

7. The optical subassembly according to claim 1, further comprising a second bonding wire connecting the first conductor pattern and the second conductor pattern.

8. The optical subassembly according to claim 1, wherein the eyelet, the support block, and the element-mounted substrate are separated.

9. The optical subassembly according to claim 1, wherein the eyelet and the pedestal are integrated.

10. The optical subassembly according to claim 1, further comprising a castellation on a side of the element-mounted substrate.

11. The optical subassembly according to claim 10, wherein the side of the element-mounted substrate is opposite to a surface, of the element-mounted substrate, facing the first surface of the eyelet.

12. The optical subassembly according to claim 11, wherein the castellation is situated at a position equal to, or closer to the pedestal than, a position where the optical element is mounted, in a direction parallel to the first surface of the eyelet and parallel to the surface of the element-mounted substrate.

13. The optical subassembly according to claim 1, wherein the pedestal and the support block are spaced.

14. The optical subassembly according to claim 1, further comprising a temperature controller between the first surface of the eyelet and the support block.

15. An optical module comprising:
   the optical subassembly according to claim 1;
   a printed circuit board; and
   a flexible printed circuit board electrically connected to the printed circuit board and the optical subassembly.

* * * * *